(12) United States Patent
Jadric et al.

(10) Patent No.: US 8,495,890 B2
(45) Date of Patent: Jul. 30, 2013

(54) COOLING MEMBER

(75) Inventors: Ivan Jadric, York, PA (US); Steve M. Hoover, York, PA (US); Kathleen S. Rogers, Dallastown, PA (US); Michael S. Todd, Jacobus, PA (US); Mathias R. Fox, Zeeland, MI (US); Christopher J. Keizer, Grandville, MI (US); Ronald C. Perry, Jenison, MI (US); Matthew T. Boerma, Holland, MI (US); Justin D. Warner, Harrisburg, PA (US); Scott V. Slothower, Dillsburg, PA (US); Julie S. Muszynski, York, PA (US); David J. Laforme, York Haven, PA (US)

(73) Assignee: Johnson Controls Technology Company, Holland, MI (US)

( * ) Notice: Subject to any disclaimer, the term of this patent is extended or adjusted under 35 U.S.C. 154(b) by 872 days.

(21) Appl. No.: 12/629,523

(22) Filed: Dec. 2, 2009

(65) Prior Publication Data
US 2010/0071396 A1    Mar. 25, 2010

Related U.S. Application Data

(63) Continuation-in-part of application No. 12/057,787, filed on Mar. 28, 2008, now Pat. No. 8,149,579, which is a continuation-in-part of application No. 11/932,479, filed on Oct. 31, 2007, now Pat. No. 7,876,561.

(60) Provisional application No. 60/885,932, filed on Jan. 22, 2007.

(51) Int. Cl.
*F25D 23/12* (2006.01)

(52) U.S. Cl.
USPC .................................................. 62/259.2

(58) Field of Classification Search
USPC .......... 62/259.2; 361/699, 702, 704; 165/80.4
See application file for complete search history.

(56) References Cited

U.S. PATENT DOCUMENTS

| 3,593,103 A | 7/1971 | Chandler et al. |
| 4,308,491 A | 12/1981 | Joyner, Jr. et al. |

(Continued)

FOREIGN PATENT DOCUMENTS

| DE | 33 29 325 A | 3/1984 |
| DE | 37 44 353 C | 4/1989 |

(Continued)

OTHER PUBLICATIONS

Johnson Controls, Inc., Variable Speed Drives Power Up, article, 2008, Johnson Controls, Inc., Milwaukee, WI, USA.

(Continued)

*Primary Examiner* — Melvin Jones
(74) *Attorney, Agent, or Firm* — McNees Wallace & Nurick LLC

(57) ABSTRACT

A cooling member for a variable speed drive is disclosed. The cooling member includes including at least two channels, each channel including at least one inlet and at least one outlet, a first passageway configured to provide fluid to the at least two channels through the at least one inlet of each channel, a second passageway configured to receive fluid from the at least one outlet of each channel the at least two channels, and a connector to connect the cooling member to a second cooling member.

18 Claims, 12 Drawing Sheets

U.S. PATENT DOCUMENTS

| | | | |
|---|---|---|---|
| 4,587,474 A | 5/1986 | Espelage et al. | |
| 4,628,991 A | 12/1986 | Hsiao et al. | |
| 4,758,771 A | 7/1988 | Saito et al. | |
| 5,005,640 A | 4/1991 | Grote et al. | |
| 5,081,368 A | 1/1992 | West | |
| 5,111,280 A | 5/1992 | Iversen | |
| 5,123,080 A | 6/1992 | Gillett et al. | |
| 5,127,085 A | 6/1992 | Becker et al. | |
| 5,199,487 A | 4/1993 | DiFrancesco et al. | |
| 5,203,401 A | 4/1993 | Hamburgen et al. | |
| 5,220,804 A | 6/1993 | Tilton et al. | |
| 5,293,070 A | 3/1994 | Burgess et al. | |
| 5,298,848 A | 3/1994 | Ueda et al. | |
| 5,316,075 A | 5/1994 | Quon et al. | |
| 5,317,805 A | 6/1994 | Hoopman et al. | |
| 5,410,230 A | 4/1995 | Bessler et al. | |
| 5,463,528 A | 10/1995 | Umezawa | |
| 5,539,617 A | 7/1996 | Bochtler | |
| 5,592,058 A | 1/1997 | Archer et al. | |
| 5,631,821 A | 5/1997 | Muso | |
| 5,646,458 A | 7/1997 | Bowyer et al. | |
| 5,675,473 A | 10/1997 | McDunn et al. | |
| 5,747,955 A | 5/1998 | Rotunda et al. | |
| 5,796,234 A | 8/1998 | Vrionis | |
| 5,869,946 A | 2/1999 | Carobolante | |
| 5,936,855 A | 8/1999 | Salmon | |
| 5,969,966 A | 10/1999 | Sawa et al. | |
| 6,005,362 A | 12/1999 | Enjeti et al. | |
| 6,031,751 A | 2/2000 | Janko | |
| 6,034,872 A | 3/2000 | Chrysler et al. | |
| 6,072,302 A | 6/2000 | Underwood et al. | |
| 6,118,676 A | 9/2000 | Divan et al. | |
| 6,124,632 A | 9/2000 | Lo et al. | |
| 6,160,722 A | 12/2000 | Thommes et al. | |
| 6,166,937 A | 12/2000 | Yamamura et al. | |
| 6,213,195 B1 | 4/2001 | Sutrina et al. | |
| 6,239,513 B1 | 5/2001 | Dean et al. | |
| 6,257,320 B1 | 7/2001 | Wargo | |
| 6,276,148 B1 | 8/2001 | Shaw | |
| 6,313,600 B1 | 11/2001 | Hammond et al. | |
| 6,348,775 B1 | 2/2002 | Edelson et al. | |
| 6,434,003 B1 | 8/2002 | Roy et al. | |
| 6,457,542 B1 | 10/2002 | Hosono et al. | |
| 6,487,096 B1 | 11/2002 | Gilbreth et al. | |
| 6,559,562 B1 | 5/2003 | Rostron | |
| 6,686,718 B2 | 2/2004 | Jadric et al. | |
| 6,719,039 B2 | 4/2004 | Calaman et al. | |
| 6,768,284 B2 | 7/2004 | Lee et al. | |
| 6,801,019 B2 | 10/2004 | Haydock et al. | |
| 6,867,970 B2 | 3/2005 | Muller et al. | |
| 6,961,244 B2 | 11/2005 | Tsuchiya et al. | |
| 7,025,607 B1 | 4/2006 | Das et al. | |
| 7,031,161 B2 | 4/2006 | Miettinen et al. | |
| 7,081,734 B1 | 7/2006 | Jadric et al. | |
| 7,173,823 B1 | 2/2007 | Rinehart et al. | |
| 7,177,153 B2 | 2/2007 | Radosevich et al. | |
| 7,210,304 B2 | 5/2007 | Nagashima et al. | |
| 7,212,406 B2 | 5/2007 | Kaishian et al. | |
| 7,289,329 B2 | 10/2007 | Chen et al. | |
| 7,301,772 B2 | 11/2007 | Tilton et al. | |
| 7,511,942 B2 | 3/2009 | Thrap | |
| 7,522,403 B1 | 4/2009 | Rinehart et al. | |
| 2002/0186545 A1 | 12/2002 | Fukada et al. | |
| 2003/0015873 A1 | 1/2003 | Khalizadeh et al. | |
| 2003/0052544 A1 | 3/2003 | Yamamoto et al. | |
| 2003/0133267 A1 | 7/2003 | Beihoff et al. | |
| 2005/0052848 A1 | 3/2005 | Hamman | |
| 2005/0057210 A1 | 3/2005 | Ueda et al. | |
| 2005/0068001 A1 | 3/2005 | Skaug et al. | |
| 2005/0162875 A1 | 7/2005 | Rodriguez et al. | |
| 2006/0209512 A1 | 9/2006 | Taniguchi et al. | |
| 2006/0288709 A1* | 12/2006 | Reidy | 62/3.4 |
| 2007/0063668 A1 | 3/2007 | Schnetzka et al. | |
| 2007/0177352 A1 | 8/2007 | Monfarad et al. | |
| 2007/0230127 A1 | 10/2007 | Peugh et al. | |
| 2007/0253164 A1 | 11/2007 | Matsuo et al. | |
| 2008/0310109 A1 | 12/2008 | Park et al. | |
| 2009/0141419 A1 | 6/2009 | Pal et al. | |

FOREIGN PATENT DOCUMENTS

| | | |
|---|---|---|
| EP | 0 272 776 A2 | 6/1988 |
| EP | 0283954 A2 | 9/1988 |
| EP | 0313366 A2 | 4/1989 |
| EP | 0422221 A1 | 4/1991 |
| EP | 0603860 A | 6/1994 |
| EP | 0734198 A2 | 9/1996 |
| EP | 1300937 A2 | 4/2003 |
| EP | 1770774 A2 | 4/2007 |
| FR | 2 355 266 | 1/1978 |
| FR | 2715773 A1 | 8/1995 |
| JP | 60-037756 | 2/1985 |
| JP | 62-142021 | 6/1987 |
| JP | 4-026374 A | 1/1992 |
| JP | 5-068376 A | 3/1993 |
| JP | 5-327257 A | 12/1993 |
| JP | 5-335769 A | 12/1993 |
| JP | 6-105563 A | 4/1994 |
| JP | 7-335798 A | 12/1995 |
| JP | 8-167529 A | 6/1996 |
| JP | 11-346480 A | 12/1999 |
| JP | 2000-058746 A | 2/2000 |
| JP | 2000-323635 A | 11/2000 |
| JP | 2001-126948 A | 5/2001 |
| JP | 2002-176767 A | 6/2002 |
| WO | 93/14559 A1 | 7/1993 |
| WO | 97/32168 A1 | 9/1997 |
| WO | 2009058417 A1 | 5/2009 |

OTHER PUBLICATIONS

Annabelle Van Zyl, Rene Spee, Alex Faveluke, and Shibashis Bhowmik; Voltange Sag Ride-Through for Adjustable-Speed Drives With Active Rectifiers; IEEE Transactions on Industry Applications; Nov./Dec. 1998; vol. 34, Issue No. 6.

Annette Von Jouanne, Prasad N. Enjeti, and Basudeb Banerjee; Assessment of Ride-Through Alternatives for Adjustable-Speed Drives; IEEE Transactions on Industry Applications; Jul./Aug. 1999; vol. 35, Issue No. 4.

IBM Corp.; Water Impingement Test Cold Plate; IBM Technical Disclosure Bulletin; Nov. 1, 1991; vol. 34, No. 6, pp. 220-221.

\* cited by examiner

US 8,495,890 B2

COOLING MEMBER

CROSS REFERENCE TO RELATED APPLICATIONS

This application is a continuation in part of U.S. patent application Ser. No. 11/932,479, filed Oct. 31, 2007, entitled COOLING SYSTEM FOR VARIABLE SPEED DRIVES AND INDUCTORS and granted as U.S. Pat. No. 7,876,561, which claims the benefit of U.S. Provisional Application No. 60/885,932, filed Jan. 22, 2007, entitled VARIABLE SPEED DRIVES SYSTEMS AND METHODS and this application is a continuation in part of U.S. patent application Ser. No. 12/057,787, filed Mar. 28, 2008, entitled COOLING MEMBER and granted as U.S. Pat. No. 8,149,579, all of which applications being hereby incorporated by reference.

BACKGROUND

The present application relates generally to variable speed drives. The application relates more specifically to a cooling member for a power semiconductor module in a variable speed drive.

Variable speed drives (VSDs) used for heating, ventilation, air-conditioning and refrigeration (HVAC&R) systems typically use metal, for example, copper, cooling members or cooling blocks for mounting and temperature regulation of insulated gate bipolar transistor (IGBT) semiconductor switches. Metal cooling blocks are expensive for use in VSDs due to high material and labor costs, such as with machining, associated with manufacturing the metal cooling blocks. VSDs may also use plastic cooling blocks for cooling, which reduce material costs, but do not reduce labor costs, since the plastic cooling blocks also require machining Injection molding processes have generally not been used due to large size and low volume of plastic cooling blocks. The size of a particular cooling block is determined by the number of components, for example, modules, which are to be mounted to the cooling block. A cooling block may be designed to mount any number of modules. Each module to be mounted to the cooling block requires multiple channels to be machined into the cooling block to form a tub. Thus, a single cooling block may have a plurality of tubs, depending on the number of modules to be mounted thereto. For example, a cooling block used in a VSD may have two to six tubs to receive corresponding modules based on the output requirements of the VSD.

SUMMARY

One embodiment of the present invention relates to a cooling member for a component of a variable speed drive including at least two channels, each channel including at least one inlet and at least one outlet, a first passageway configured to provide fluid to the at least two channels through the at least one inlet of each channel, a second passageway configured to receive fluid from the at least one outlet of each channel the at least two channels, and a connector to connect the cooling member to a second cooling member.

Another embodiment of the present invention relates to a system for cooling a variable speed drive including at least two cooling members, each cooling member including a base, the base including a first surface to receive electrical components, at least two channels positioned on the first surface, each channel including at least one inlet and at least one outlet, a first passageway configured to provide fluid to the at least two channels through the corresponding at least one inlet of each channel, a second passageway configured to receive fluid from the at least one outlet of each channel of the at least two channels, and a connector to connect the cooling member to another cooling member.

Yet another embodiment of the present invention relates to a variable speed drive system including a temperature regulated component, the temperature regulated component being regulated by a cooling system and the cooling system. In the embodiment, the cooling system includes at least two cooling members. Also, each cooling member includes a base, the base including a first surface to receive electrical components, at least two tubs positioned on the first surface, each tub including at least one inlet and at least one outlet, a first passageway configured to provide fluid to the at least two tubs through the corresponding at least one inlet of each tub, a second passageway configured to receive fluid from the at least one outlet of each tub of the at least two tubs, and a connector to connect the cooling member to another cooling member.

DETAILED DESCRIPTION OF THE EXEMPLARY EMBODIMENTS

Figure 1:
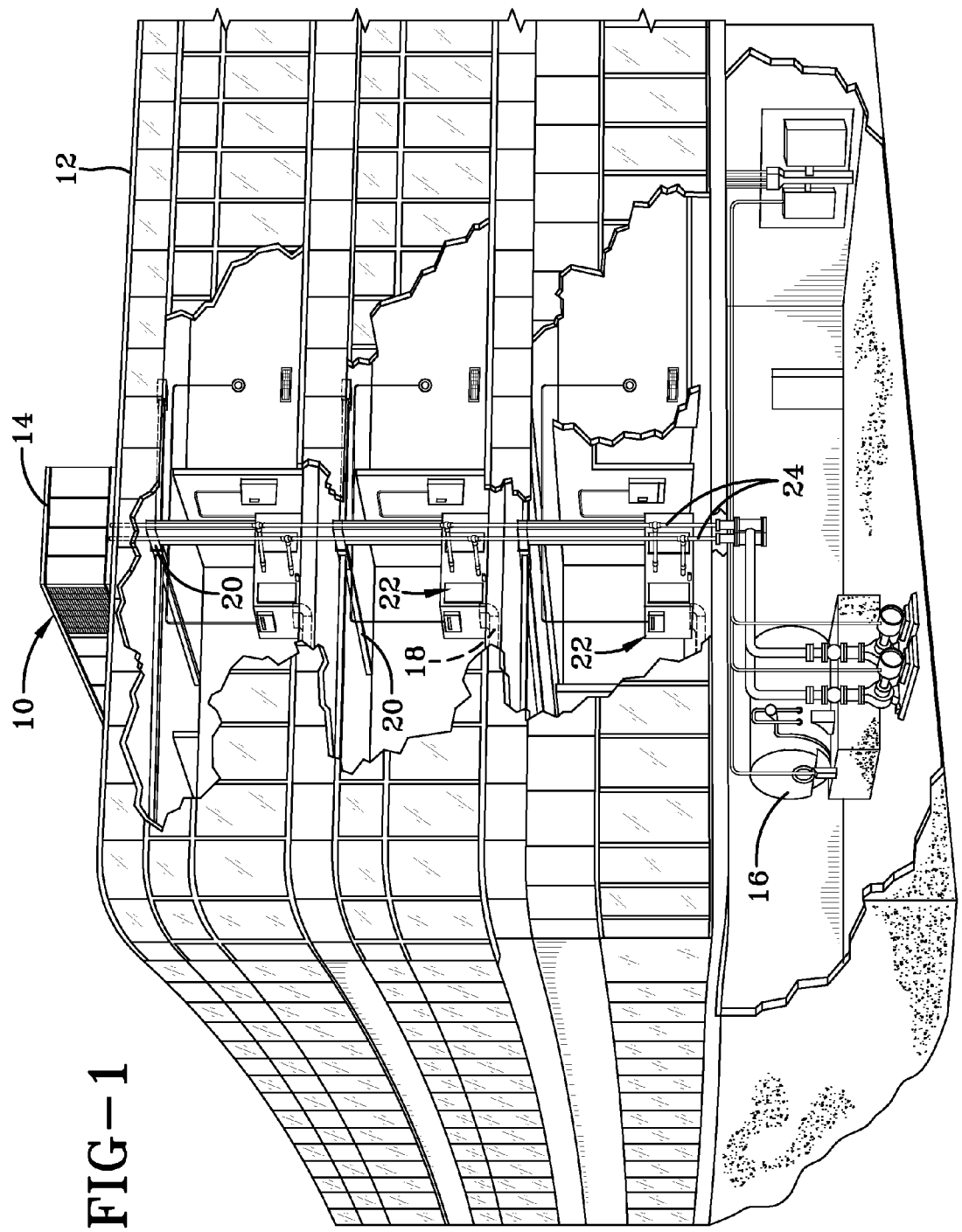
FIG. 1 shows an exemplary embodiment of a Heating, Ventilation, Air Conditioning and Refrigeration (HVAC&R) system in a commercial environment.

FIG. 1 shows an exemplary environment for a Heating, Ventilating, Air Conditioning system (HVAC system) 10 in a building 12 for a typical commercial setting. System 10 may include a compressor incorporated into a vapor compression system 14 that can supply a chilled liquid that may be used to cool building 12. System 10 can also include a boiler 16 to supply a heated liquid that may be used to heat building 12, and an air distribution system that circulates air through building 12. The air distribution system can include an air return duct 18, an air supply duct 20 and an air handler 22. Air handler 22 can include a heat exchanger that is connected to boiler 16 and vapor compression system 14 by conduits 24. The heat exchanger in air handler 22 may receive either heated liquid from boiler 16 or chilled liquid from vapor compression system 14 depending on the mode of operation of system 10. System 10 is shown with a separate air handler on each floor of building 12, but it will be appreciated that these components may be shared between or among floors.

Figure 2:
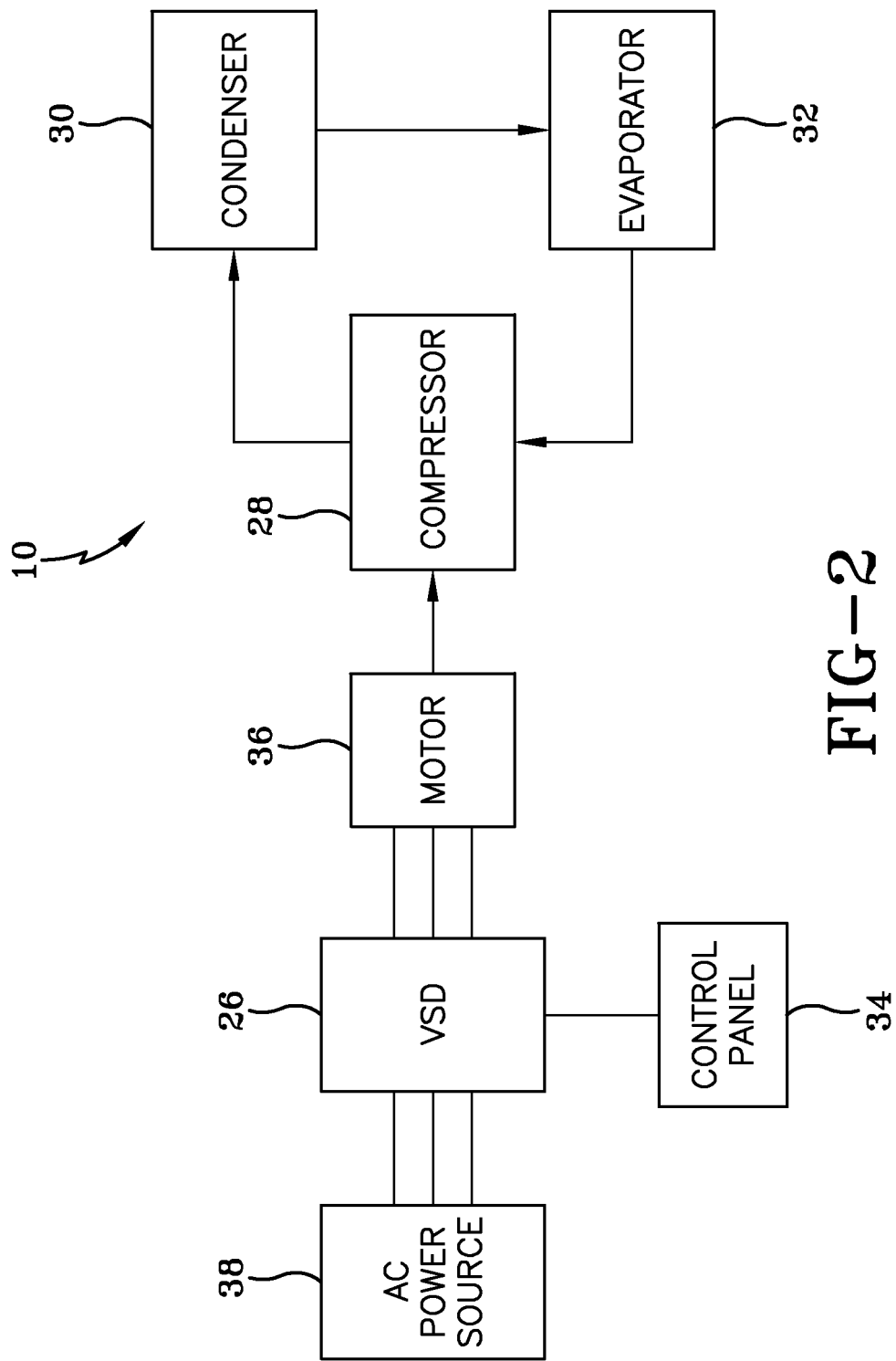
FIG. 2 schematically illustrates an exemplary embodiment of a vapor compression system that may be used in the exemplary embodiment of FIG. 1.

FIG. 2 schematically illustrates an exemplary embodiment of vapor compression system 14 with VSD 26 that may be used in building 12 in FIG. 1. Vapor compression system 14 may include compressor 28, a condenser 30, a liquid chiller or evaporator 32 and a control panel 34. Compressor 28 is driven by motor 36 that is powered by VSD 26. VSD 26 receives AC power having a particular fixed line voltage and fixed line frequency from AC power source 38 and provides AC power to motor 36 at desired voltages and desired frequencies, both of which can be varied to satisfy particular requirements. Control panel 34 can include a variety of different components such as an analog to digital (A/D) converter, a microprocessor, a non-volatile memory, and an interface board, to control operation of vapor compression system 14. Control panel 34 can also be used to control the operation of VSD 26, and motor 36.

Compressor 28 compresses a refrigerant vapor and delivers the vapor to condenser 30 through a discharge line. Compressor 28 can be any suitable type of compressor, for example, a screw compressor, a centrifugal compressor, a reciprocating compressor, a scroll compressor, etc. The refrigerant vapor delivered by compressor 28 to condenser 30 enters into a heat exchange relationship with a fluid, for example, air or water, and undergoes a phase change to a refrigerant liquid as a result of the heat exchange relationship with the fluid. The condensed liquid refrigerant from condenser 30 flows through an expansion device (not shown) to evaporator 32.

Evaporator 32 may include connections for a supply line and a return line of a cooling load. A process fluid, for example, water, ethylene glycol, calcium chloride brine or sodium chloride brine, travels into evaporator 32 via return line and exits evaporator 32 via supply line. The liquid refrigerant in evaporator 32 enters into a heat exchange relationship with the process fluid to lower the temperature of the process fluid. The refrigerant liquid in evaporator 32 undergoes a phase change to a refrigerant vapor as a result of the heat exchange relationship with the process fluid. The vapor refrigerant in evaporator 32 exits evaporator 32 and returns to compressor 28 by a suction line to complete the cycle.

Figure 3:
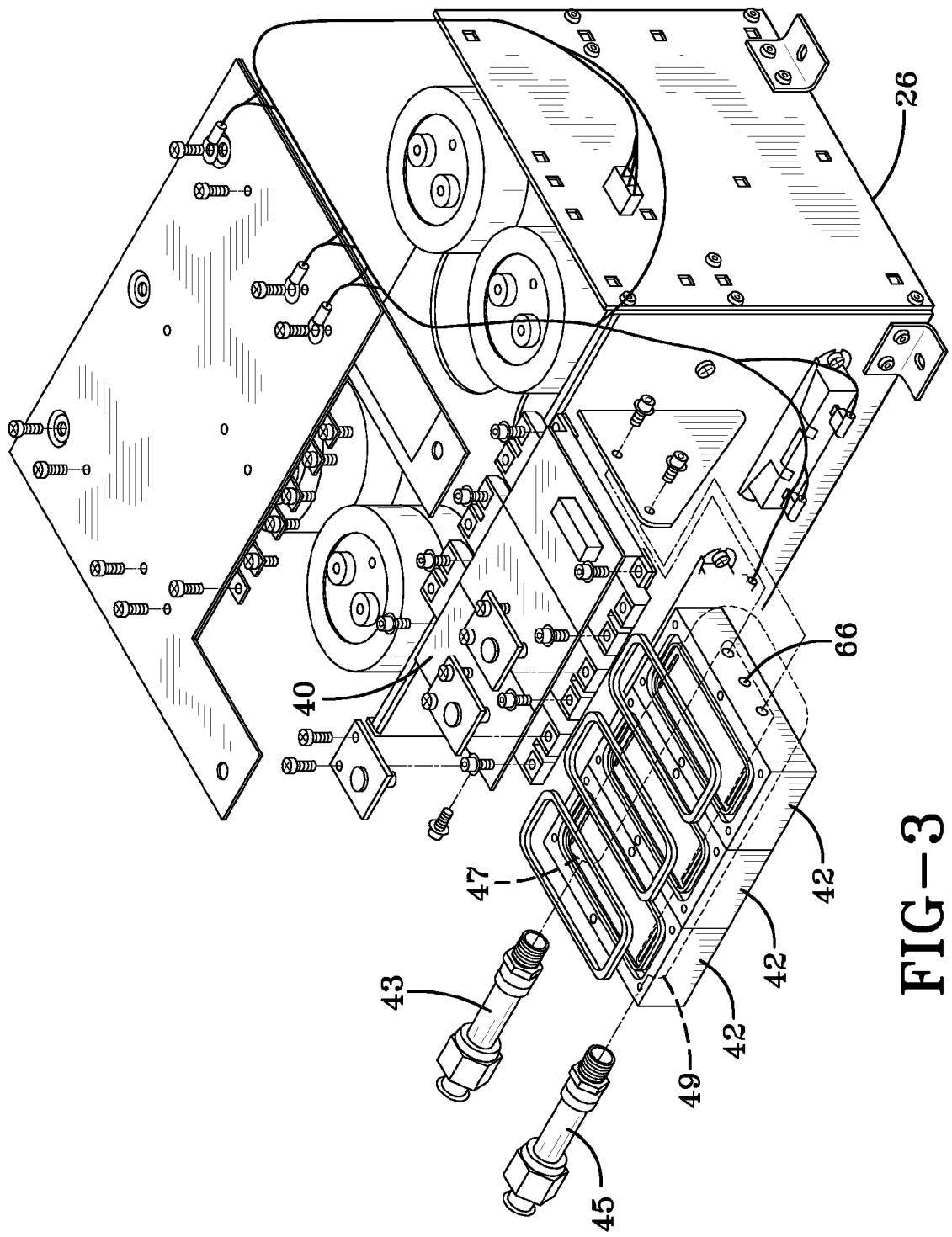
FIG. 3 shows an exploded view of a portion of a variable speed drive system with an exemplary embodiment of a cooling member.

FIG. 3 shows one part of a variable speed drive 26 with a plurality of switches 40 that are placed over cooling members 42. VSD 26 may be used to provide desired power to motors for different applications or HVAC systems. For example, such a motor may drive a compressor of a vapor compression system. Switches 40 of the VSD 26 are depicted as an Infineon module with 3 dual IGBT's, but other semiconductor devices or other electronic components that require cooling may be cooled with cooling members 42. Pipes 43, 45 are connected to inlet passageway 47 and outlet passageway 49, respectively to introduce cooling fluid into and remove cooling fluid from cooling members 42. Pipes 43 and 45 or other suitable flow passages are connected to a cooling system, which provides a continuous flow of cooling fluid to cooling members 42. A cooling fluid is applied to pipe 43, flows through the member 42, and flows out through pipe 45.

A variety of different cooling fluids, including condensed water, water and known refrigerants can be circulated in cooling members 42 and used to cool the electronic components. In addition, a variety of different cooling systems can be used to cool the cooling fluid that exits from cooling members 42.

Cooling members 42 cool modules in a VSD 26 used to power a motor of an HVAC system. The modules can be connected to cooling member 42 in a sealed relationship. The cooling fluid applied to cooling member 42 can be water that flows through cooling member 42 and a heat exchanger in a closed loop. The heat exchanger cools the water before it is reintroduced to cooling member 42. The heat exchanger can be a shell and tube type heat exchanger and water from a cooling tower of the HVAC system can be used to cool the water applied to cooling member 42.

Figure 4:
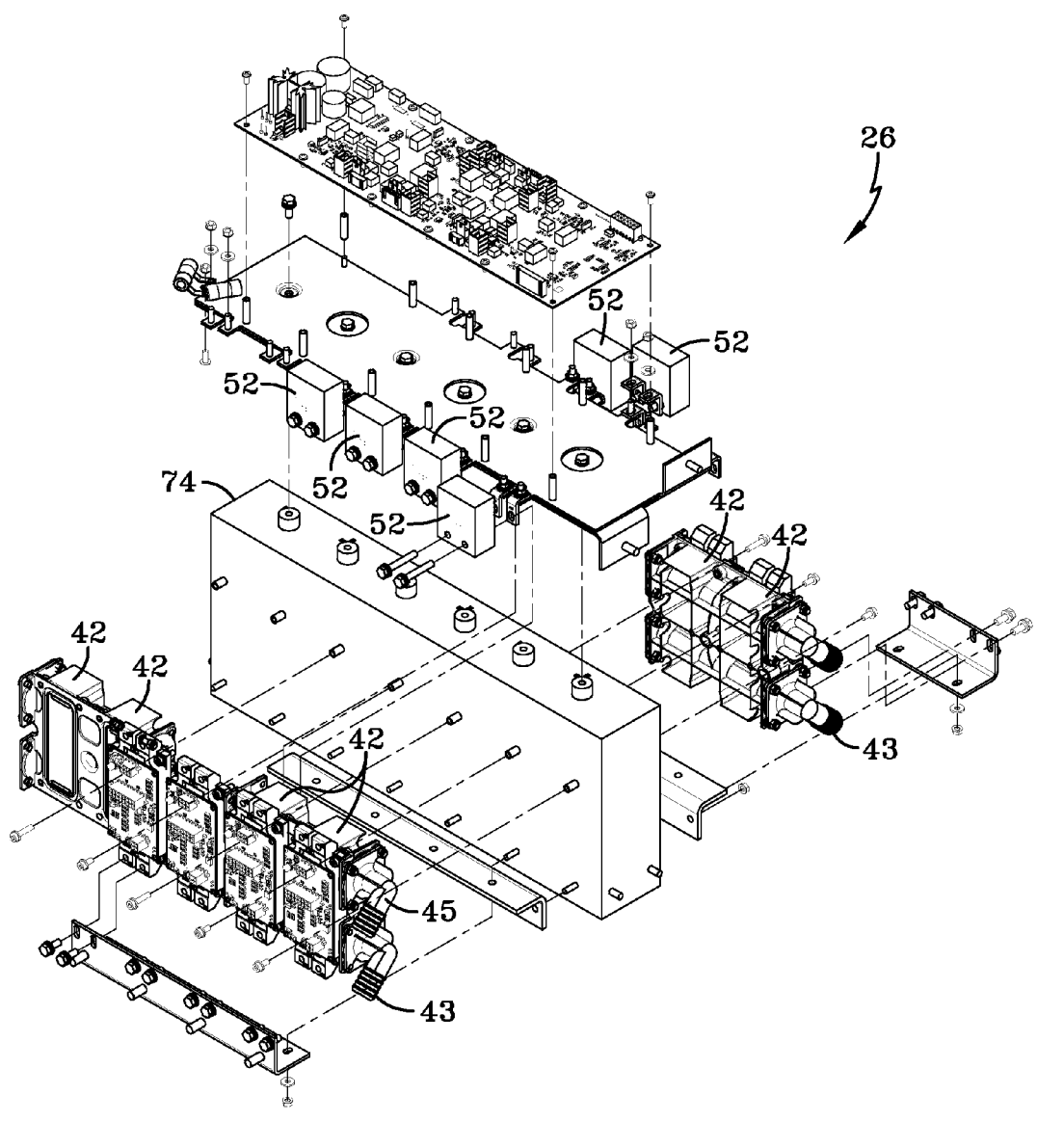
FIG. 4 shows a plurality of cooling members located on a power electronics assembly in an exemplary embodiment.

FIG. 4 shows a plurality of cooling members 42 to be mounted to a component of VSD 26. Cooling members 42 are positioned vertically and mounted on the side of components 74 (for example, dc link capacitors). In another embodiment, components 74 may be oriented in any suitable orientation, such as, vertical, horizontal, or diagonal.

Figure 5:
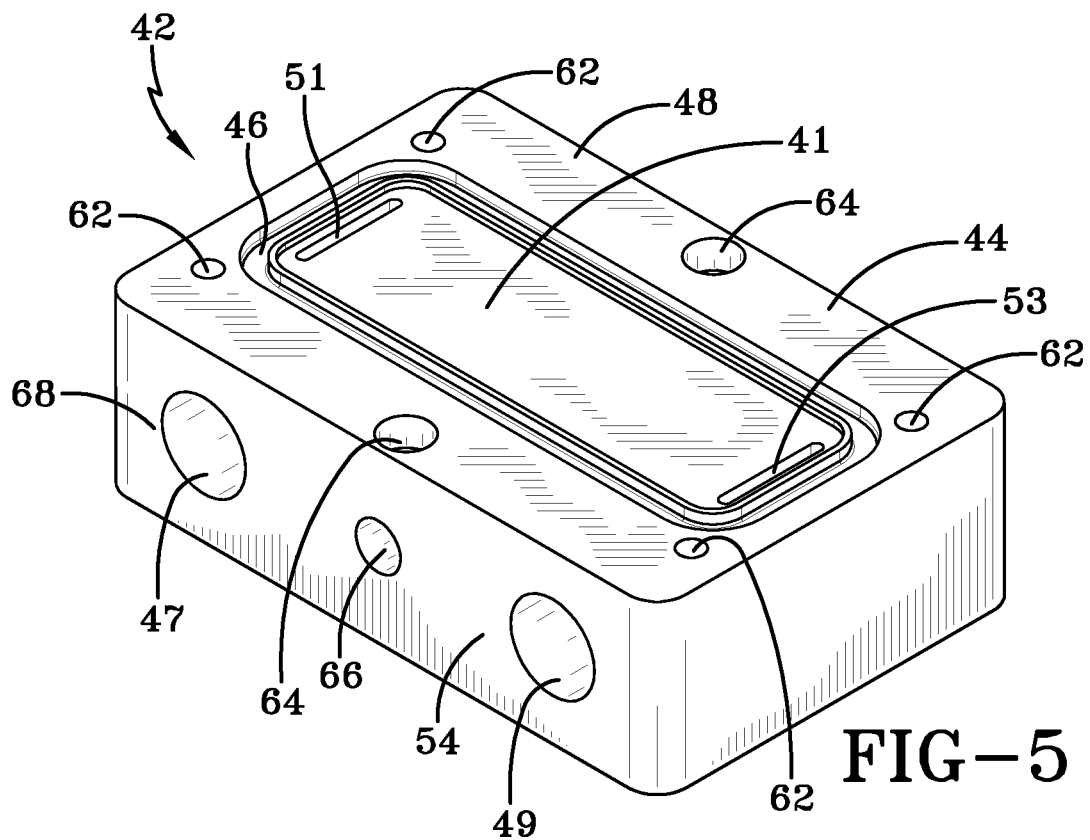
FIG. 5 shows a top perspective view of an exemplary embodiment of a cooling member.
Figure 6:
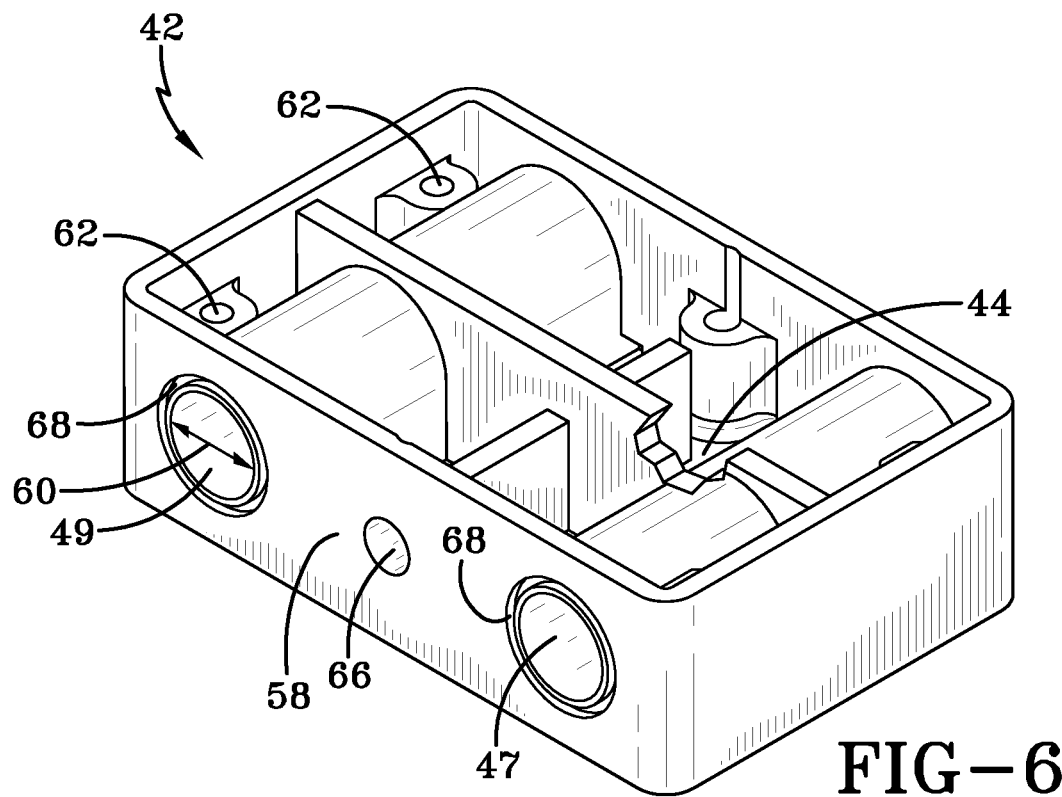
FIG. 6 shows a bottom perspective view of an exemplary embodiment of a cooling member.

In an exemplary embodiment, shown in FIGS. 5 and 6, cooling member 42 includes a plastic base 44 having a channel 46 formed on the top surface 48. In alternate embodiments, cooling member 42 may be composed of other materials such as non-metallic materials. A component, for example, a semiconductor module, can be mounted on top surface 48. Channel 46 formed on top surface 48 provides a space for an o-ring (not shown) to seal against a base plate of the component. Base 44 has an inlet passageway 47 that extends through base 44 and an outlet passageway 49 that extends through base 44. Passageways 47 and 49 have predetermined diameters 60, or cross sectional area for alternate profiles, that are sized to satisfy the flow rate and pressure drop requirements when multiple cooling members 42 are used together. For example, in one exemplary application of a 1300 hp VSD design, six cooling members are used together. It is to be understood that passageways 47 and 49 are not limited to a circular profile. A cooling liquid, for example, condenser water, is circulated through passageways 47 and 49 to provide cooling to the component.

Base 44 has a tub 41 or channel formed in top surface 48 for providing cooling to a component. A portion of cooling fluid flowing through inlet passageway 47 is diverted through a tub inlet 51 or channel inlet, across tub 41 or channel, and discharged through a tub outlet 53 or channel outlet. The cooling fluid then flows through outlet passageway 49. Cooling fluid flows across tub 41 or channel and has direct contact with a component. The cooling fluid exchanges heat with the component to cool the component.

Base 44 has at least one mounting aperture 62 for mounting a component to base 44. In addition, base 44 may have at least one VSD mounting aperture 64 for mounting base 44 to an assembly of VSD 26. A connector or fastener, for example, a screw or other suitable fastener, may be used to secure base 44 to assembly 75 and VSD 26. Base 44 also has through hole 66, intended for a through-bolt or other suitable fastener to secure and hold together multiple bases 44 for multiple components. When the through-bolt secures multiple bases 44 together, o-rings or other suitable sealing devices are compressed in grooves 68 to provide a seal between neighboring bases 44.

Figure 7:
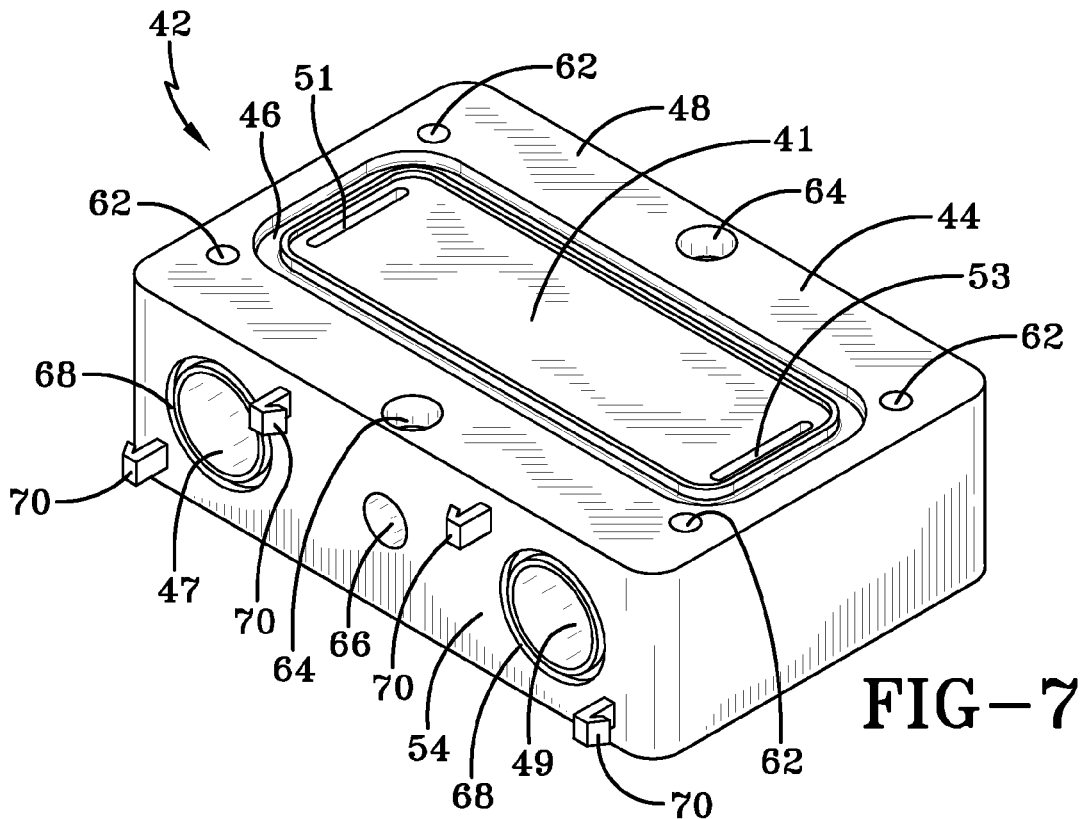
FIG. 7 shows a top perspective view of another exemplary embodiment of a cooling member.
Figure 8:
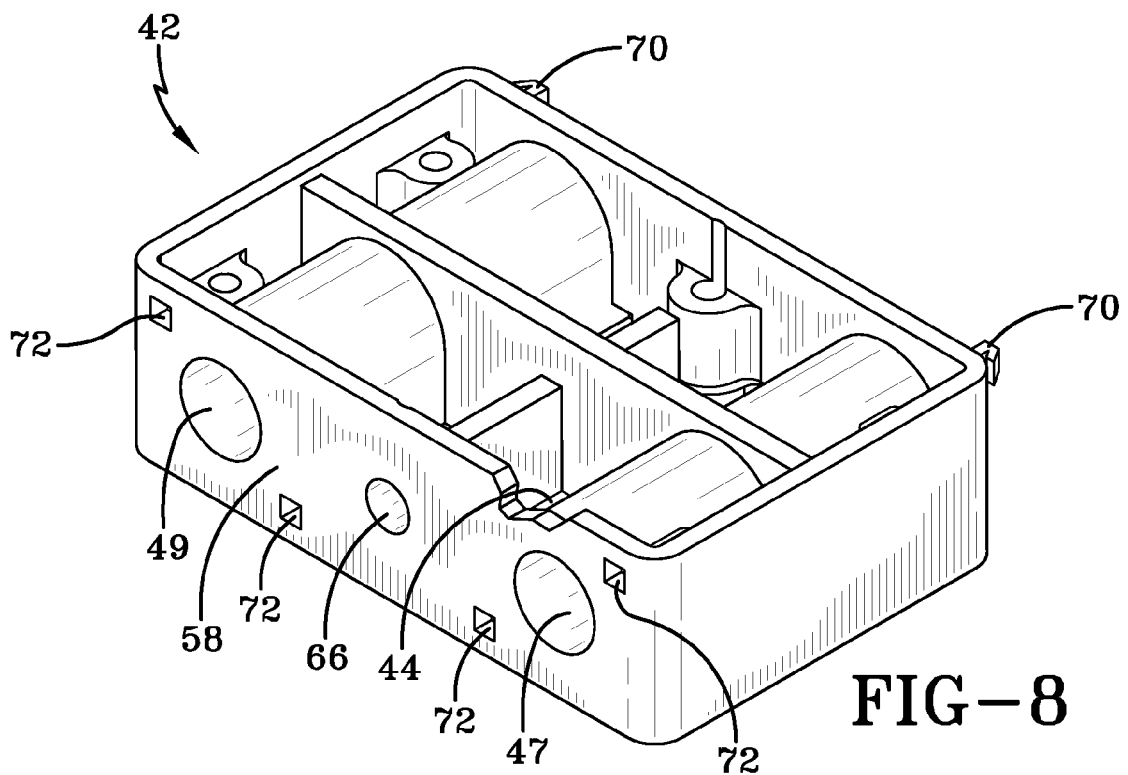
FIG. 8 shows a bottom perspective view of another exemplary embodiment of a cooling member.

FIGS. 7 and 8 show another exemplary embodiment of cooling member 42. Base 44 may have mating features or a connector, for example, fastener tabs 70 and fastener receptacles 72. The connector may connect one or more cooling members 42 to each other. The connecting of cooling members 42 may be permanent, semi-permanent, or detachable by any suitable mechanism. For example, when fastener tab 70 is inserted into fastener receptacle 72, cooling members 42 may be permanently secured thereby preventing cooling members 42 from being separated without breaking fastener tab 72. Alternatively, fastener tab 70 may be detachable by including an access region configured to receive a pin or screwdriver. Inserting the pin or screwdriver into the access region may permit fastener tab 70 to be released from fastener receptacle 72. When multiple bases are fastened together, fastener tabs 70 from one base may mate with fastener receptacles 72 on a neighboring base, providing a snap-in mechanism for securing the bases together. The snap-in mechanism also provides adequate pressure on o-rings, which may be part of the connector, used to seal between bases. Cooling member 42 may be manufactured by an injection molding process or other suitable cost-effective process or method.

Figure 9:
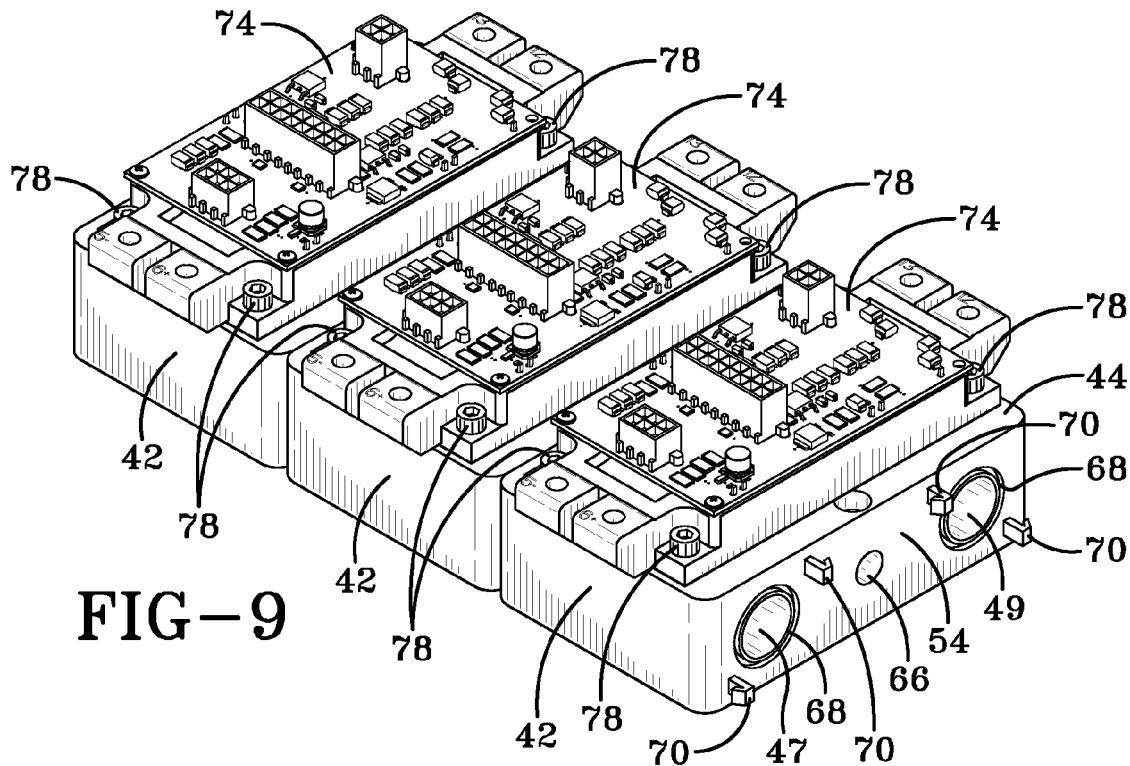
FIG. 9 shows perspective view of a plurality of cooling members in an exemplary embodiment.
Figure 10:
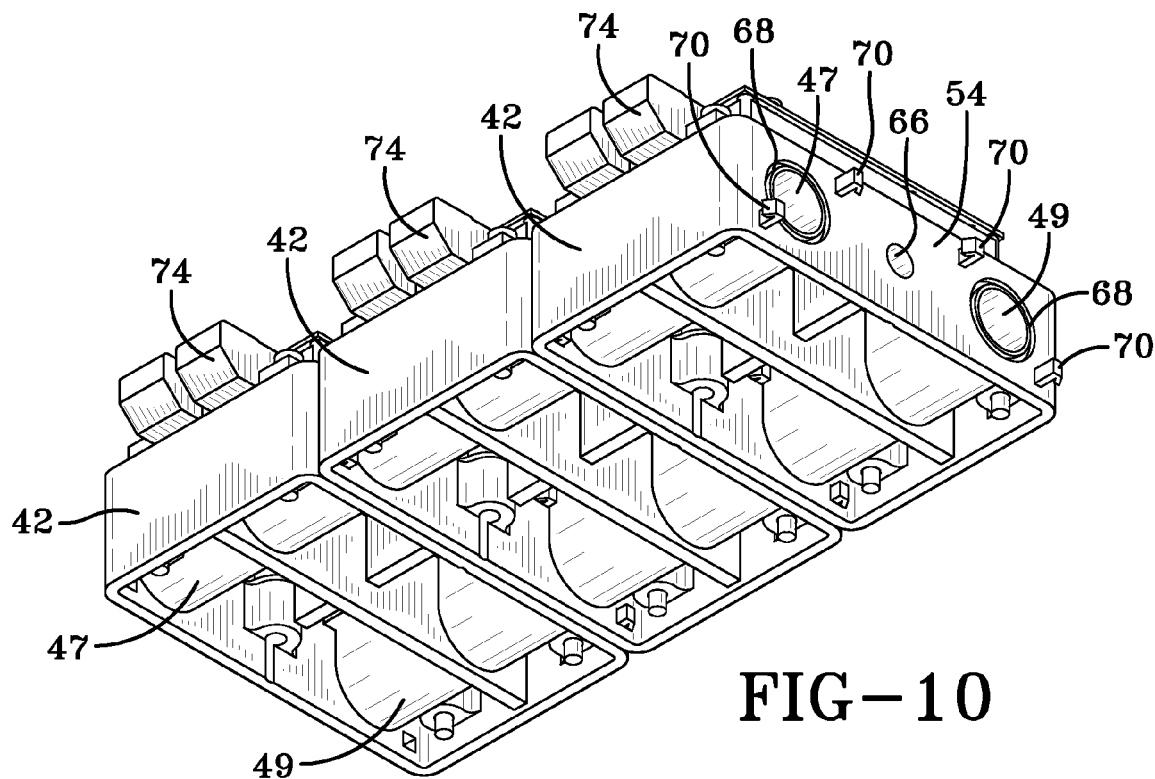
FIG. 10 shows a bottom perspective view of a plurality of cooling members in an exemplary embodiment.

FIGS. 9 and 10 show a plurality of cooling members 42 connected with components 74 to be cooled mounted on cooling members 42. When a VSD has more than one component 74, each component 74 is mounted to a corresponding base 44. As shown, component 74 is a semiconductor module with a circuit board. For example, if the VSD has four components 74, each component 74 is mounted to a separate base 44 and each base 44 is secured to a neighboring base. Base 44 may have a through-hole 66 extending axially through the base 44 from side surface 54 to the opposite side surface. At least one fastener, for example, a screw, may be secured in through-hole 66 and into the through-hole of the next base 44, thereby securing the multiple bases to one another. When multiple bases are secured together, the passageways 47, 49 of each base 44 are in fluid communication with each other, forming one large passageway that extends through all of the bases. Inlet 47 and outlet 49 may have a groove 68 (which may be part of the connector) to accept an o-ring or other suitable sealant or sealer. When multiple bases are fastened together, the o-ring is compressed between the bases to seal the passageways and prevent leaks. A plurality of fasteners 78 may secure component 74 to cooling member 42.

Figure 11:
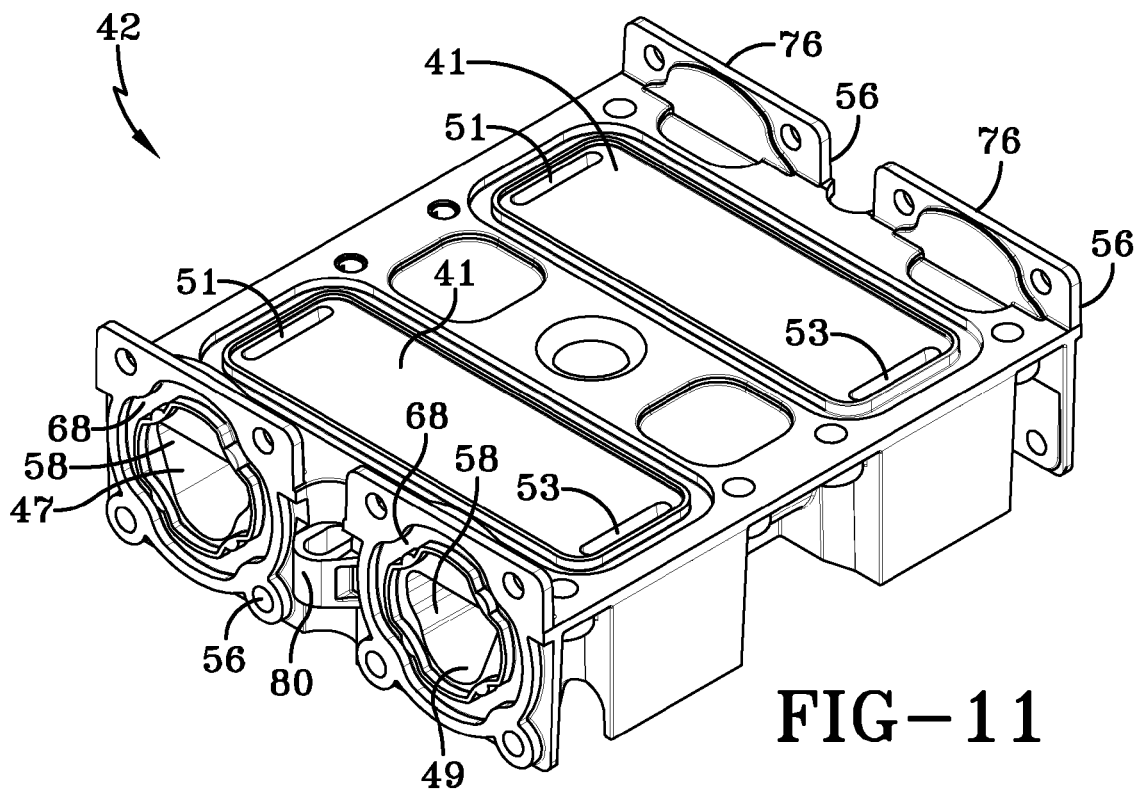
FIG. 11 shows a perspective view of an exemplary embodiment of a cooling member.
Figure 12:
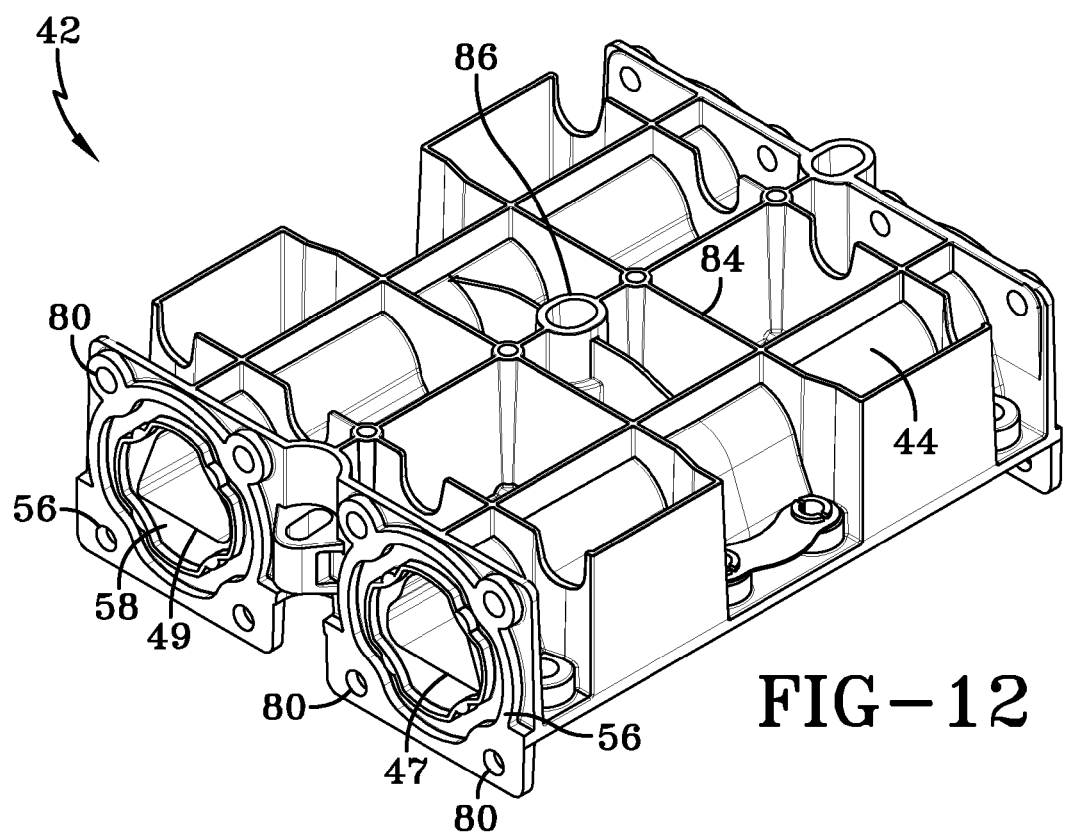
FIG. 12 shows a bottom perspective view of the cooling member in FIG. 11.

FIGS. 11 and 12 show an exemplary embodiment of a cooling member 42 having more than one tub 41 or channel formed in base 44. FIG. 11 shows cooling member 42 having two tubs 41 or channels for cooling components or devices. In other words, as many as two components or devices may be placed on cooling member 42 to be cooled. Each tub 41 or channel is formed a predetermined distance or is evenly spaced from the center of cooling member 42. For example, each tub or channel may be three inches from the end of its respective cooling member 42 to maintain uniformity with all cooling members 42 when interconnecting several cooling members 42. A portion of cooling fluid flowing through inlet passageway 47 is diverted through tub inlets 51, across tubs 41, and discharged through tub outlets 53. The cooling fluid then flows through outlet passageway 49. Cooling fluid flows across tub 41 and has direct contact with a component or device to exchange heat with the component and cool the component. Cooling member 42 includes a connection plate 56 at the inlets 58 and outlets 76 of passageways 47 and 49 for facilitating the connection of an additional cooling member 42 or additional cooling members 42 or termination plate. Connector can include a connection plate 56 including a groove 68 for receiving an o-ring or other suitable sealing device. When the cooling members 42 are mated or connected to each other, the o-ring or other sealing device is compressed in groove 68 of each cooling member 42 to provide a substantially leak proof seal between cooling members. In other words, the o-ring or other sealing device helps to prevent or minimize the leaking of fluid flowing through passageway 47 and passageway 49 when multiple cooling members 42 are connected. In an exemplary embodiment, to increase ease of assembly, groove 68 may be an o-ring groove containing several pinch-points that hold the o-ring in place prior to assembling cooling blocks. Connection plate 56 also includes a plurality of fastener apertures 80 for receiving and securing a plurality of connectors. In another embodiment, the O-ring and seal may be formed from molded parts.

Referring specifically to FIG. 12, several ribs 84 are formed within base 44. Ribs 84 are formed to provide structural strength to cooling member 42 when a device or component is mounted thereon. FIG. 12 also shows a device mount 86 for receiving a fastener (not shown) and for securing a device or component, such as an IGBT module to cooling member 42. FIG. 12 also shows passageway 47 and passageway 49 extending through base 44, thereby providing a flowpath for refrigerant or fluid through cooling member 42.

Figure 13:
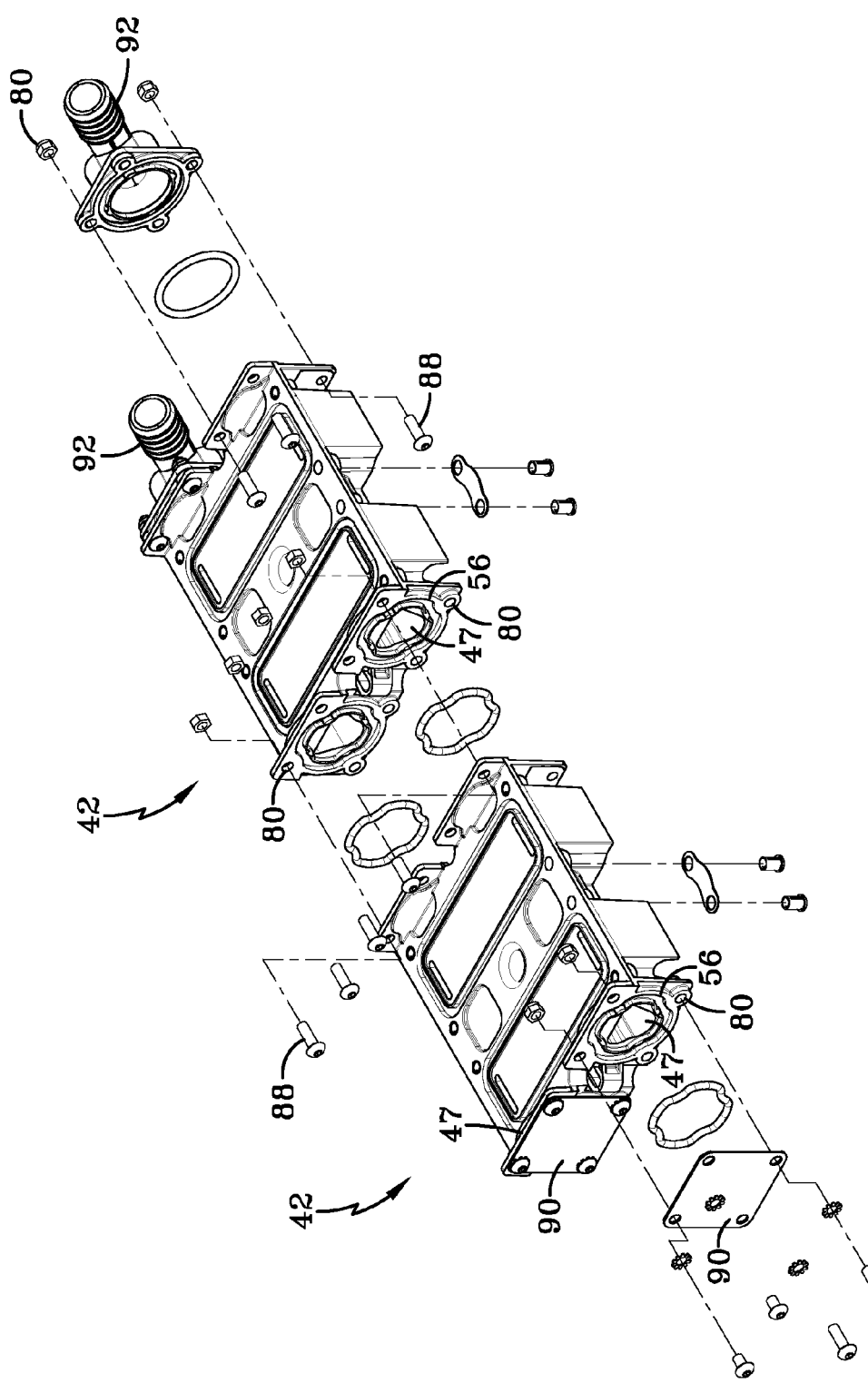
FIG. 13 shows an exploded perspective view of two cooling members in an exemplary embodiment.

FIG. 13 shows two cooling members 42 connected by fasteners 88 through fastener apertures 80, providing a four tub cooling member 42 for up to four separate devices or components. End plates 90 are secured to the ends of passageway 47 and passageway 49 on a side of passageway 47 and passageway 49 that is not connected to another cooling member 42. End plates 90 prevent fluid from leaking or flowing from cooling member 42 and maintain the fluid in passageway 47 and passageway 49. O-rings can be compressed between end plates 90 and connection plates 56 to prevent leaking of fluid from passageway 47 and passageway 49. End plates 90 may be two separate end plates 90, where each end plate 90 is secured to an opening of passageway 47 and passageway 49, or end plate 90 may be one unitary end plate 90, which extends across both openings of passageway 47 and passageway 49. Fluid flow is maintained through tubs 41 via tub inlets 51 and tub outlets 53. In other embodiments, cooling member 42 may include three or more tubs. For example, having two tub cooling members and three tub cooling members enables one to form cooling members of four tubs, five tubs, or six tubs, etc. with only two configurations of cooling members thereby removing the need for a separate dye for each configuration.

Figure 14:
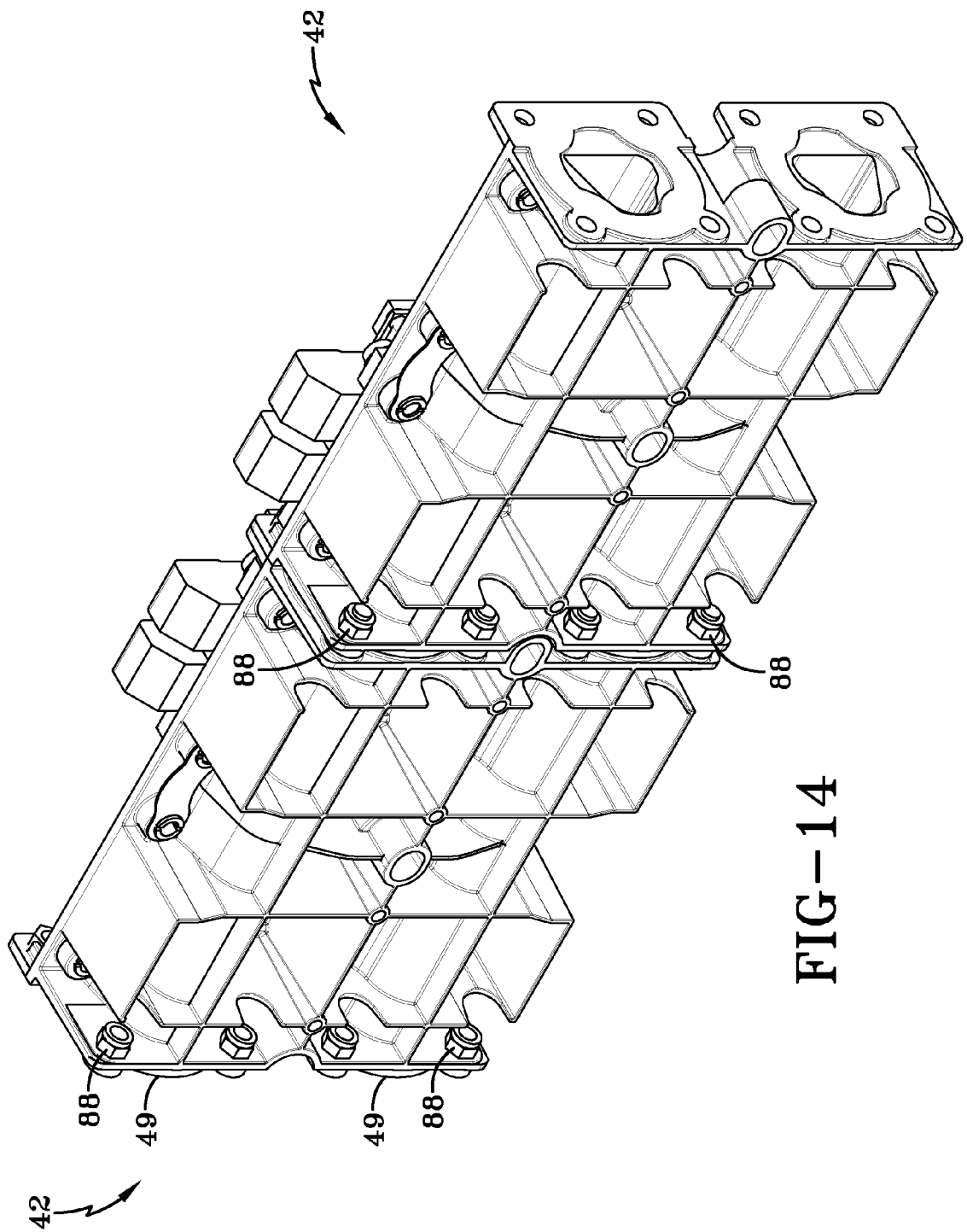
FIG. 14 shows a bottom perspective view of two cooling members in an exemplary embodiment.

FIG. 14 shows a bottom view of the cooling members 42 of FIG. 13. Fasteners 88 are shown as being bolts with nuts to secure one cooling member 42 to a second cooling member 42 through connection plates 56. Fasteners 88 are also shown as being bolts with nuts to secure end plates 90 to connection plates 56 to prevent fluid leaking from passageway 47 and passageway 49.

Figure 15:
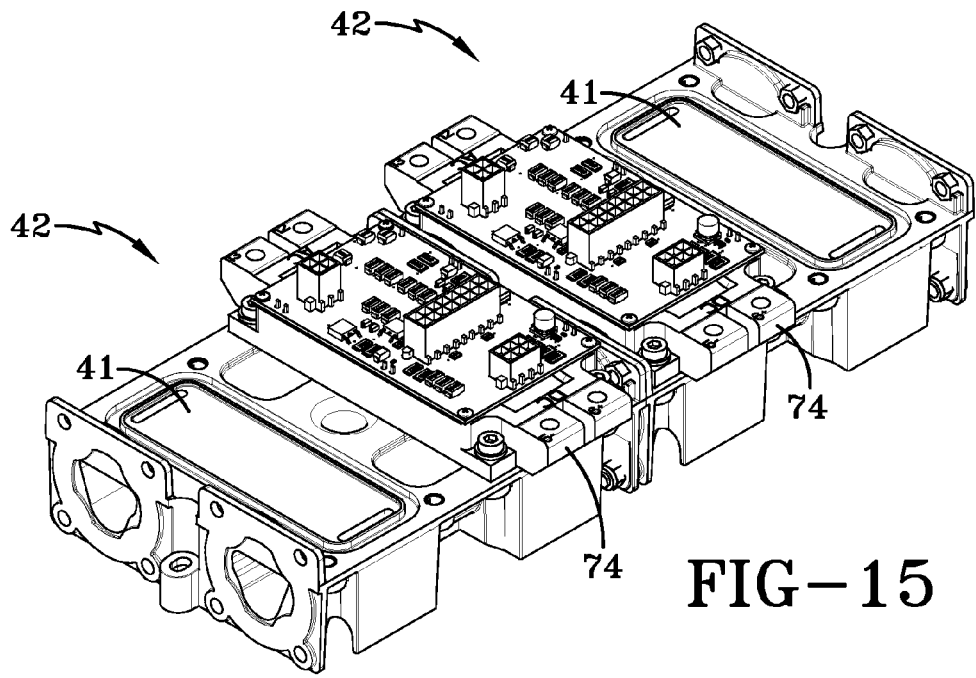
FIG. 15 shows a top perspective view of the two cooling members of FIG. 13 with components mounted thereon.

FIG. 15 shows the cooling members 42 of FIGS. 13 and 14 having two components 74 mounted thereon. Components 74 are shown as partial IGBT modules, however components 74 can be any suitable device. Each component 74 is mounted to cooling member 42, such that a single tub 41 is covered by one component 74.

Figure 16:
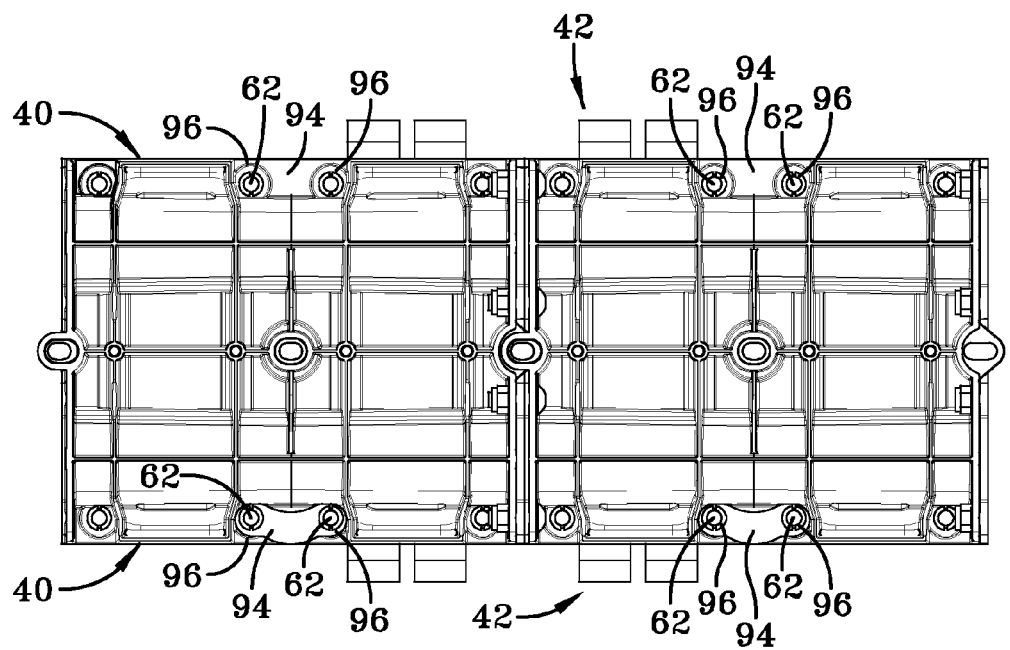
FIG. 16 shows a bottom perspective view of the two cooling members of FIG. 15 with components mounted thereon.

FIG. 16 shows a bottom view of the cooling members 42 of FIG. 15. When components 74 are mounted on the same cooling member 42, a grounding strip 94 is mounted between components 74 on the bottom of cooling member 42. Grounding strip 94 is mounted such that one end of grounding strip 94 contacts a first component mounting aperture 62 and contacts a second component mounting aperture 62. Each component mounting aperture 62 is electrically conductive and can have an electrically conductive portion 96 lining each component mounting aperture 62. Grounding strip 94 does not contact component mounting apertures 62 from different cooling members 42. In other words, grounding strip 94 does not cross over connection plate 56 to an adjacent cooling member 42.

Figure 17:
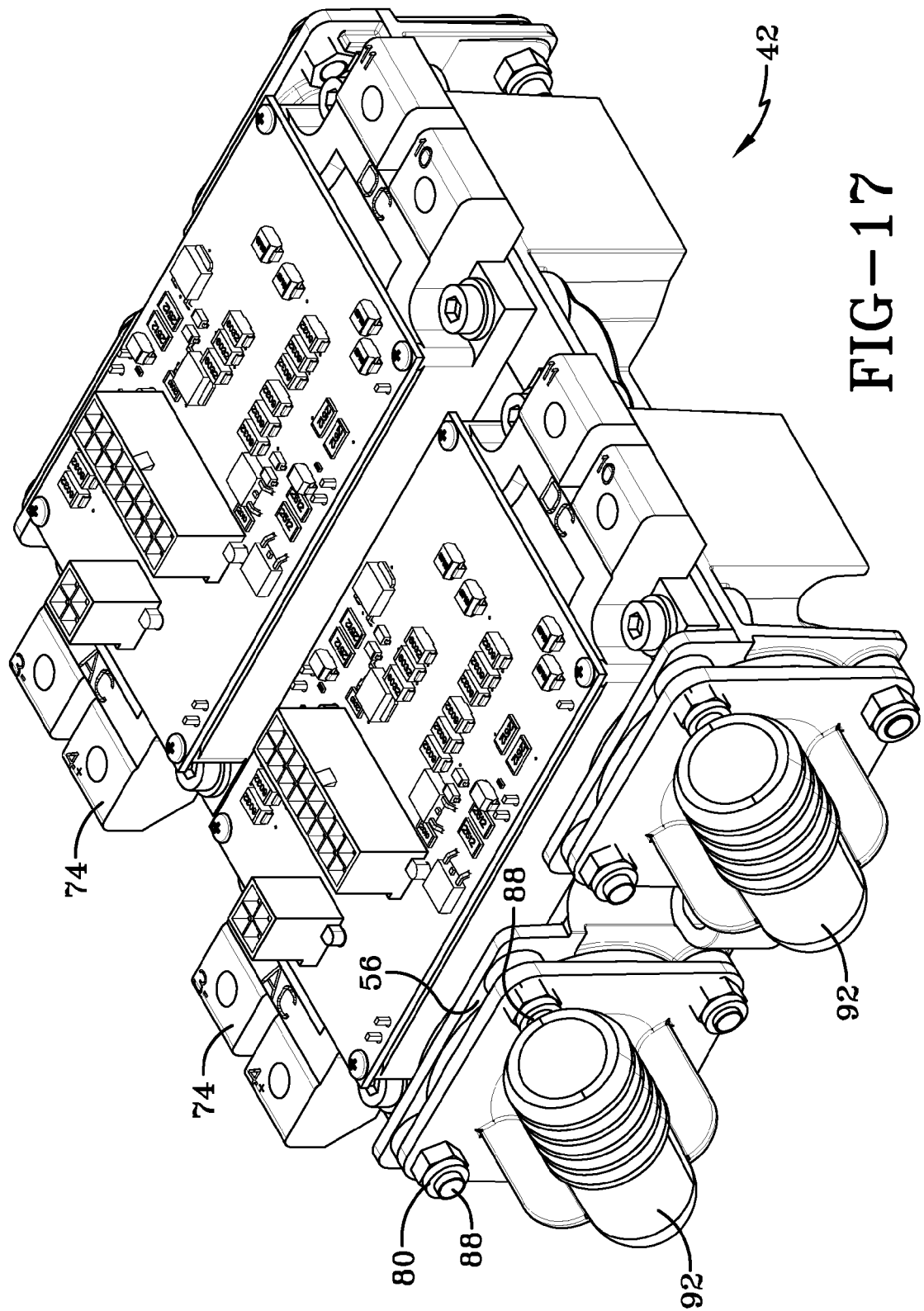
FIG. 17 shows a top perspective view of an exemplary embodiment of a cooling member with components and hose barbs attached thereto.

FIG. 17 shows a perspective view of cooling members 42 similar to cooling members 42 shown in FIGS. 13, 14, and 15 with components 74 attached thereto. Hose barbs 92 are secured to an end of passageway 47 and to receive fluid from passageway 49 to provide fluid to passageway 47 and passageway 49. Hose barbs 92 may have and 'L' shape for facilitating attachment to a fluid supply or source. Hose barbs 92 may also be any suitable shape for attachment to a fluid supply or source and cooling member 42. Hose barbs 92 are secured to cooling member 42 with fasteners 88 through fastener apertures 80 in connection plate 56. An O-ring can be compressed between hose barbs 92 and connection plate 56 to prevent, substantially prevent or minimize leaking of fluid from passageway 47 and passageway 49. In one embodiment, hose barbs 92 may include a quick-connect feature configured to releasably attach to a hose or other suitable member to hose barbs 92.

Cooling members 42 may be manufactured with an injection molding process or other suitable processes. The use of an injection molding process or other similar processes maintains minimal costs of manufacture as well as uniformity between cooling members. Cooling members 42 may be manufactured with a plastic or other suitable non conductive material and may have distinct properties which may include, but are not limited to being non-porous, strength for supporting components mounted thereto and/or chemical compatibility with the fluid flowing through passageway 47 and passageway 49.

While only certain features and embodiments of the invention have been illustrated and described, many modifications and changes may occur to those skilled in the art (For example, variations in sizes, dimensions, structures, shapes and proportions of the various elements, values of parameters (For example, temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (For example, those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A cooling member for a component of a variable speed drive, the cooling member comprising:
   at least two channels, each channel comprising at least one inlet and at least one outlet;
   a first passageway configured to provide fluid to the at least two channels through the at least one inlet of each channel;
   a second passageway configured to receive fluid from the at least one outlet of each channel of the at least two channels;
   a connector to connect the cooling member to a second cooling member; and
   the connector comprises a groove to secure a gasket or an o-ring between the cooling member and the second cooling member.

2. The cooling member of claim 1, wherein the connector comprises a connection plate and the groove is positioned in the connection plate.

3. The cooling member of claim 1, wherein the groove comprises a pinch-point for securing the o-ring.

4. A cooling member for a component of a variable speed drive, the cooling member comprising:
   at least two channels, each channel comprising at least one inlet and at least one outlet;
   a first passageway configured to provide fluid to the at least two channels through the at least one inlet of each channel;
   a second passageway configured to receive fluid from the at least one outlet of each channel of the at least two channels;
   a connector to connect the cooling member to a second cooling member; and
   the connector comprises a fastener tab and a fastener receptacle to secure the cooling member to the second cooling member.

5. A cooling member for a component of a variable speed drive, the cooling member comprising:
   at least two channels, each channel comprising at least one inlet and at least one outlet;
   a first passageway configured to provide fluid to the at least two channels through the at least one inlet of each channel;
   a second passageway configured to receive fluid from the at least one outlet of each channel of the at least two channels;
   a connector to connect the cooling member to a second cooling member; and
   a grounding strip in electrical communication with a lining of a first component mounting aperture and a second lining of a second component mounting aperture, the component being mounted to the first component mounting aperture.

6. A cooling member for a component of a variable speed drive, the cooling member comprising:
   at least two channels, each channel comprising at least one inlet and at least one outlet;
   a first passageway configured to provide fluid to the at least two channels through the at least one inlet of each channel;
   a second passageway configured to receive fluid from the at least one outlet of each channel of the at least two channels;
   a connector to connect the cooling member to a second cooling member; and
   at least one end plate to seal the first passageway and the second passageway.

7. A cooling member for a component of a variable speed drive, the cooling member comprising:
   at least two channels, each channel comprising at least one inlet and at least one outlet;
   a first passageway configured to provide fluid to the at least two channels through the at least one inlet of each channel;

a second passageway configured to receive fluid from the at least one outlet of each channel of the at least two channels;

a connector to connect the cooling member to a second cooling member; and the cooling member is an injection molded cooling member.

8. A cooling member for a component of a variable speed drive, the cooling member comprising:

at least two channels, each channel comprising at least one inlet and at least one outlet;

a first passageway configured to provide fluid to the at least two channels through the at least one inlet of each channel;

a second passageway configured to receive fluid from the at least one outlet of each channel of the at least two channels;

a connector to connect the cooling member to a second cooling member; and a hose barb configured for quick connecting a hose to the cooling member.

9. A system for cooling an electrical component of a variable speed drive, the system comprising:

at least two cooling members, each cooling member comprising:

a base, the base comprising a first surface to receive electrical components;

at least two channels positioned on the first surface, each channel comprising at least one inlet and at least one outlet;

a first passageway configured to provide fluid to the at least two channels through the corresponding at least one inlet of each channel;

a second passageway configured to receive fluid from the at least one outlet of each channel of the at least two channels;

a connector to connect the cooling member to another cooling member; and the connector comprises a groove to secure a gasket between the at least two cooling members.

10. The system of claim 9, wherein the connector comprises a connection plate and the groove is positioned in the connection plate.

11. A system for cooling an electrical component of a variable speed drive, the system comprising:

at least two cooling members, each cooling member comprising:

a base, the base comprising a first surface to receive electrical components;

at least two channels positioned on the first surface, each channel comprising at least one inlet and at least one outlet;

a first passageway configured to provide fluid to the at least two channels through the corresponding at least one inlet of each channel;

a second passageway configured to receive fluid from the at least one outlet of each channel of the at least two channels;

a connector to connect the cooling member to another cooling member; and the connector comprises a fastener tab and a fastener receptacle to secure the at least two cooling members.

12. A system for cooling an electrical component of a variable speed drive, the system comprising:

at least two cooling members, each cooling member comprising:

a base, the base comprising a first surface to receive electrical components;

at least two channels positioned on the first surface, each channel comprising at least one inlet and at least one outlet;

a first passageway configured to provide fluid to the at least two channels through the corresponding at least one inlet of each channel;

a second passageway configured to receive fluid from the at least one outlet of each channel of the at least two channels;

a connector to connect the cooling member to another cooling member; and at least one end plate to seal the first passageway and the second passageway.

13. A system for cooling an electrical component of a variable speed drive, the system comprising:

at least two cooling members, each cooling member comprising:

a base, the base comprising a first surface to receive electrical components;

at least two channels positioned on the first surface, each channel comprising at least one inlet and at least one outlet;

a first passageway configured to provide fluid to the at least two channels through the corresponding at least one inlet of each channel;

a second passageway configured to receive fluid from the at least one outlet of each channel of the at least two channels;

a connector to connect the cooling member to another cooling member; and at least one of the at least two cooling members is an injection molded cooling member.

14. A system for cooling an electrical component of a variable speed drive, the system comprising:

at least two cooling members, each cooling member comprising:

a base, the base comprising a first surface to receive electrical components;

at least two channels positioned on the first surface, each channel comprising at least one inlet and at least one outlet;

a first passageway configured to provide fluid to the at least two channels through the corresponding at least one inlet of each channel;

a second passageway configured to receive fluid from the at least one outlet of each channel of the at least two channels;

a connector to connect the cooling member to another cooling member; and one of the at least two cooling members comprises two channels and a second of the at least two cooling members cooling members comprises three channels.

15. A system for cooling an electrical component of a variable speed drive, the system comprising:

at least two cooling members, each cooling member comprising:

a base, the base comprising a first surface to receive electrical components;

at least two channels positioned on the first surface, each channel comprising at least one inlet and at least one outlet;

a first passageway configured to provide fluid to the at least two channels through the corresponding at least one inlet of each channel;

a second passageway configured to receive fluid from the at least one outlet of each channel of the at least two channels;
a connector to connect the cooling member to another cooling member; and
a grounding strip, the grounding strip being configured to be in electrical communication with the electrical component, a lining of a first component mounting aperture, and a second lining of a second component mounting aperture, wherein mounting the electrical component to the first component mounting aperture grounds the electrical component.

16. A system for cooling an electrical component of a variable speed drive, the system comprising:
at least two cooling members, each cooling member comprising:
a base, the base comprising a first surface to receive electrical components;
at least two channels positioned on the first surface, each channel comprising at least one inlet and at least one outlet;
a first passageway configured to provide fluid to the at least two channels through the corresponding at least one inlet of each channel;
a second passageway configured to receive fluid from the at least one outlet of each channel of the at least two channels;
a connector to connect the cooling member to another cooling member; and
one of the at least two cooling members comprises three channels and a second of the at least two cooling members cooling members comprises three channels.

17. A system for cooling an electrical component of a variable speed drive, the system comprising:
at least two cooling members, each cooling member comprising:
a base, the base comprising a first surface to receive electrical components;
at least two channels positioned on the first surface, each channel comprising at least one inlet and at least one outlet;
a first passageway configured to provide fluid to the at least two channels through the corresponding at least one inlet of each channel;
a second passageway configured to receive fluid from the at least one outlet of each channel of the at least two channels; and
a connector to connect the cooling member to another cooling member; and
one of the at least two cooling members comprises two channels and a second of the at least two cooling members cooling members comprises two channels.

18. A variable speed drive system, the system comprising:
an electrical component, the electrical component being in a heat transfer relationship with a cooling system; and
the cooling system, the cooling system comprising:
at least two cooling members, each cooling member comprising:
a base, the base comprising a first surface to receive electrical components;
at least two tubs positioned on the first surface, each tub comprising at least one inlet and at least one outlet;
a first passageway configured to provide fluid to the at least two tubs through the corresponding at least one inlet of each tub;
a second passageway configured to receive fluid from the at least one outlet of each tub of the at least two tubs; and
a connector to connect the cooling member to another cooling member.

* * * * *